(12) United States Patent
Yamaji et al.

(10) Patent No.: US 12,105,164 B2
(45) Date of Patent: Oct. 1, 2024

(54) MAGNETIC SENSOR

(71) Applicant: TDK Corporation, Tokyo (JP)

(72) Inventors: Yuichiro Yamaji, Tokyo (JP); Tamon Kasajima, Tokyo (JP); Taiju Akushichi, Tokyo (JP)

(73) Assignee: TDK Corporation, Tokyo (JP)

( * ) Notice: Subject to any disclaimer, the term of this patent is extended or adjusted under 35 U.S.C. 154(b) by 174 days.

(21) Appl. No.: 17/966,061

(22) Filed: Oct. 14, 2022

(65) Prior Publication Data

US 2023/0118663 A1    Apr. 20, 2023

(30) Foreign Application Priority Data

Oct. 18, 2021   (JP) .................................. 2021-170293

(51) Int. Cl.
   *G01R 33/09*   (2006.01)
   *G01R 33/00*   (2006.01)

(52) U.S. Cl.
   CPC ....... *G01R 33/091* (2013.01); *G01R 33/0094* (2013.01)

(58) Field of Classification Search
   None
   See application file for complete search history.

(56) References Cited

U.S. PATENT DOCUMENTS

| | | |
|---|---|---|
| 2015/0115938 A1 | 4/2015 | Kasajima et al. |
| 2017/0219661 A1* | 8/2017 | Hata ................... G01R 33/0029 |

FOREIGN PATENT DOCUMENTS

JP    2015-087228 A    5/2015

OTHER PUBLICATIONS

Extended European Search Report issued in corresponding European Patent Application No. 22201932.5-1212, dated Mar. 13, 2023.

\* cited by examiner

*Primary Examiner* — Jas A Sanghera
(74) *Attorney, Agent, or Firm* — Rimon P.C.

(57) ABSTRACT

Disclosed herein is a magnetic sensor that includes a first magnetic field sensor that detects an environmental magnetic field to generate a first magnetic field signal, a second magnetic field sensor that detects a detection target magnetic field to generate a second magnetic field signal, a first filter that removes an AC component in a predetermined frequency band from the first magnetic field signal to extract a DC component, a first compensation coil that applies a first cancelling magnetic field to the second magnetic field sensor based on the DC component, a second compensation coil that applies a second cancelling magnetic field to the second magnetic field sensor based on the second magnetic field signal, and a second filter that removes an AC component in at least a predetermined frequency band from the second magnetic field signal.

5 Claims, 5 Drawing Sheets

MAGNETIC SENSOR

CROSS-REFERENCE TO RELATED APPLICATIONS

The disclosure of Japanese Patent Application No. 2021-170293 filed on Oct. 18, 2021 including the specification, drawings and abstract is incorporated herein by reference in its entirety.

BACKGROUND OF THE INVENTION

Field of the Invention

The present invention relates to a magnetic sensor and, more particularly, to a magnetic sensor capable of cancelling the influence of an environmental magnetic field.

Description of Related Art

Magnetic sensors of a type capable of detecting a feeble magnetic field is strongly influenced by an environmental magnetic field such as earth magnetism, so that in order for magnetic sensors of such a type to accurately detect a detection-target magnetic field, it is necessary to cancel the influence of the environmental magnetic field. As a magnetic sensor capable of canceling the influence of the environmental magnetic field, there is known a magnetic sensor described in JP 2015-087228A. The magnetic sensor described in JP 2015-087228A includes a first magnetic field detecting part for detecting an environmental magnetic field, a second magnetic field detecting part for detecting a detection-target magnetic field, and a magnetic field generating part for applying a cancelling magnetic field corresponding to an output signal from the first magnetic field detecting part to the second magnetic field detecting part. With this configuration, the environmental magnetic field applied to the second magnetic field detecting part is cancelled, with the result that only the detection-target magnetic field is applied to the second magnetic field detecting part.

However, the environmental magnetic field may sometimes include an AC component such as power supply noise in addition to a DC component such as earth magnetism. The AC component of the environmental magnetic field differs in phase depending on spatial position. Thus, the magnetic sensor described in JP 2015-087228A has a possibility of failing to correctly cancel the AC component of the environmental magnetic field, and there is a possibility that the AC component of the environmental magnetic field is superimposed on a detected magnetic field signal in an amplified state depending on the positions of the first and second magnetic field detecting parts.

SUMMARY

It is therefore an object of the present invention to provide a magnetic sensor capable of cancelling the AC component included in the environmental magnetic field irrespective of the position of a to-be-detected magnetic field sensor.

A magnetic sensor according to the present invention includes: an environmental magnetic field sensor that detects an environmental magnetic field to generate an environmental magnetic field signal; a to-be-detected magnetic field sensor that detects a detection target magnetic field to generate a to-be-detected magnetic field signal; a first filter that removes an AC component in a predetermined frequency band from the environmental magnetic field signal to extract a DC component; a first compensation coil that applies a first cancelling magnetic field to the to-be-detected magnetic field sensor based on the DC component; a second compensation coil that applies a second cancelling magnetic field to the to-be-detected magnetic field sensor based on the to-be-detected magnetic field signal; and a second filter that removes an AC component in at least a predetermined frequency band from the to-be-detected magnetic field signal.

According to the present invention, the first filter removes the AC component in a predetermined frequency band from the environmental magnetic field signal, and the second filter removes the AC component in a predetermined frequency band from the to-be-detected magnetic field signal. Thus, it is possible to cancel the AC component included in the environmental magnetic field irrespective of the positions of the environmental magnetic field sensor and to-be-detected magnetic field sensor.

In the present invention, the to-be-detected magnetic field sensor may include an external magnetism collection member that collects a magnetic field, and the first compensation coil may be wound around the external magnetism collection member. This allows a relatively large current to flow in the first compensation coil, so that even a strong environmental magnetic field can be cancelled.

In the present invention, the to-be-detected magnetic field sensor may include a magneto-sensitive element formed in a sensor chip, and the second compensation coil may be a thin-film coil formed in the sensor chip. This can reduce the number of components and can cancel the to-be-detected magnetic field signal with high accuracy.

The magnetic sensor according to the present invention may include a plurality of unit sensors each constituted by the to-be-detected magnetic field sensor and first and second compensation coils. This makes it possible to detect the to-be-detected magnetic field at a plurality of positions. In this case, the first compensation coils included in the plurality of unit sensors may be connected in series to each other. This allows the same cancelling current to flow in all the first compensation coils.

As described above, according to the present invention, there can be provided a magnetic sensor capable of cancelling the AC component included in the environmental magnetic field.

BRIEF DESCRIPTION OF THE DRAWINGS

The above and other objects, features and advantages of this invention will become more apparent by reference to the following detailed description of the invention taken in conjunction with the accompanying drawings, wherein.

DETAILED DESCRIPTION OF THE EMBODIMENTS

Preferred embodiments of the present invention will now be explained in detail with reference to the drawings.

Figure 1:
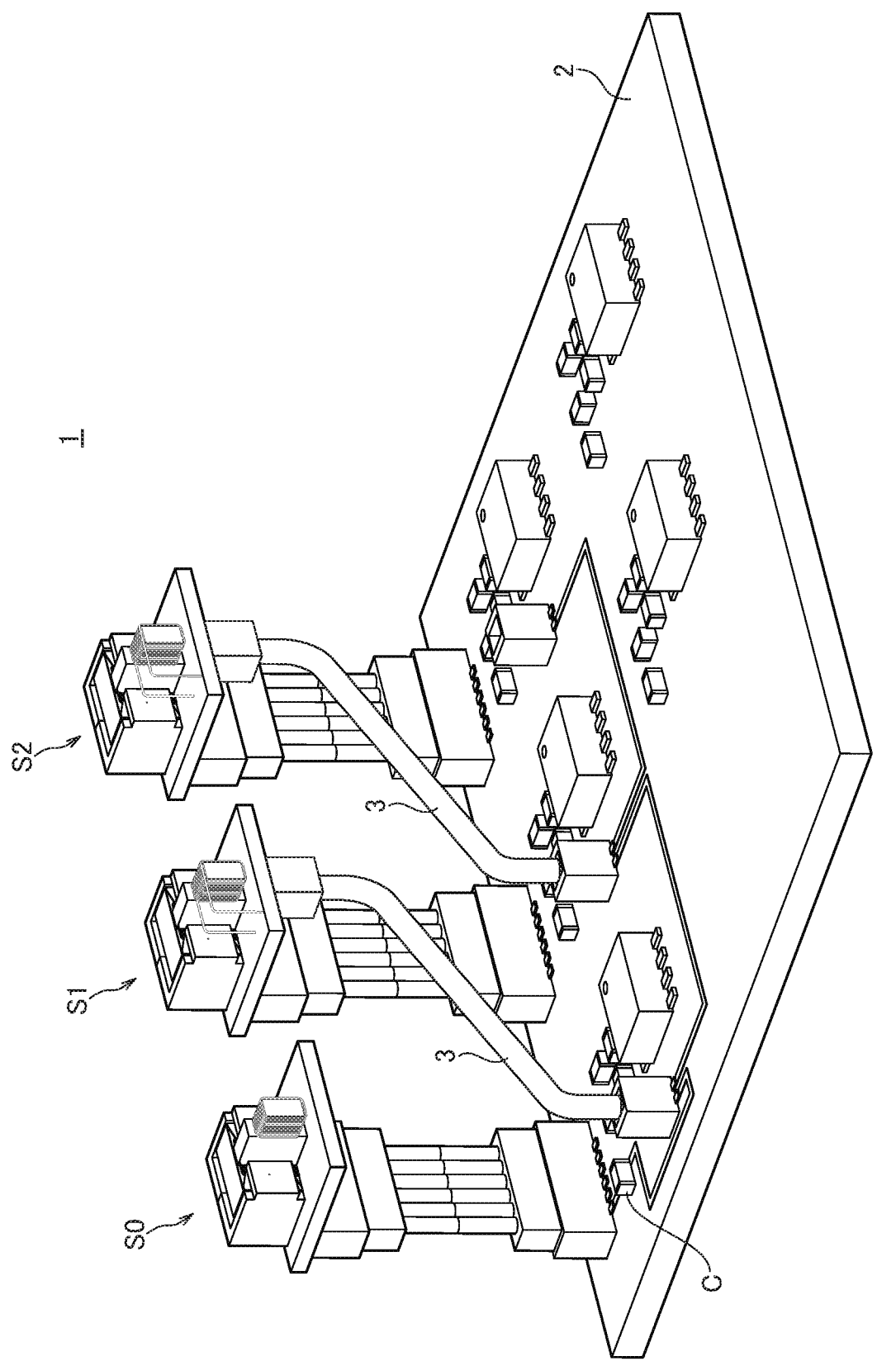
FIG. 1 is a schematic perspective view illustrating the outer appearance of a magnetic sensor 1 according to an embodiment of the present invention.

FIG. 1 is a schematic perspective view illustrating the outer appearance of a magnetic sensor 1 according to an embodiment of the present invention.

As illustrated in FIG. 1, the magnetic sensor 1 according to the present embodiment has an environmental magnetic field sensor S0 and to-be-detected magnetic field sensors S1 and S2, all of which are mounted on a circuit board 2. The environmental magnetic field sensor S0 is a sensor for detecting an environmental magnetic field, and the to-be-detected magnetic field sensors S1 and S2 are each a sensor for detecting a detection-target magnetic field. Although two to-be-detected magnetic field sensors S1 and S2 are used in the example illustrated in FIG. 1, the number of the to-be-detected magnetic field sensors is not particularly limited and may be one or three or more. The environmental magnetic field sensor S0 and to-be-detected magnetic field sensors S1 and S2 have basically the same structure and are the same in detection sensitivity of a magnetic field.

Figure 2:
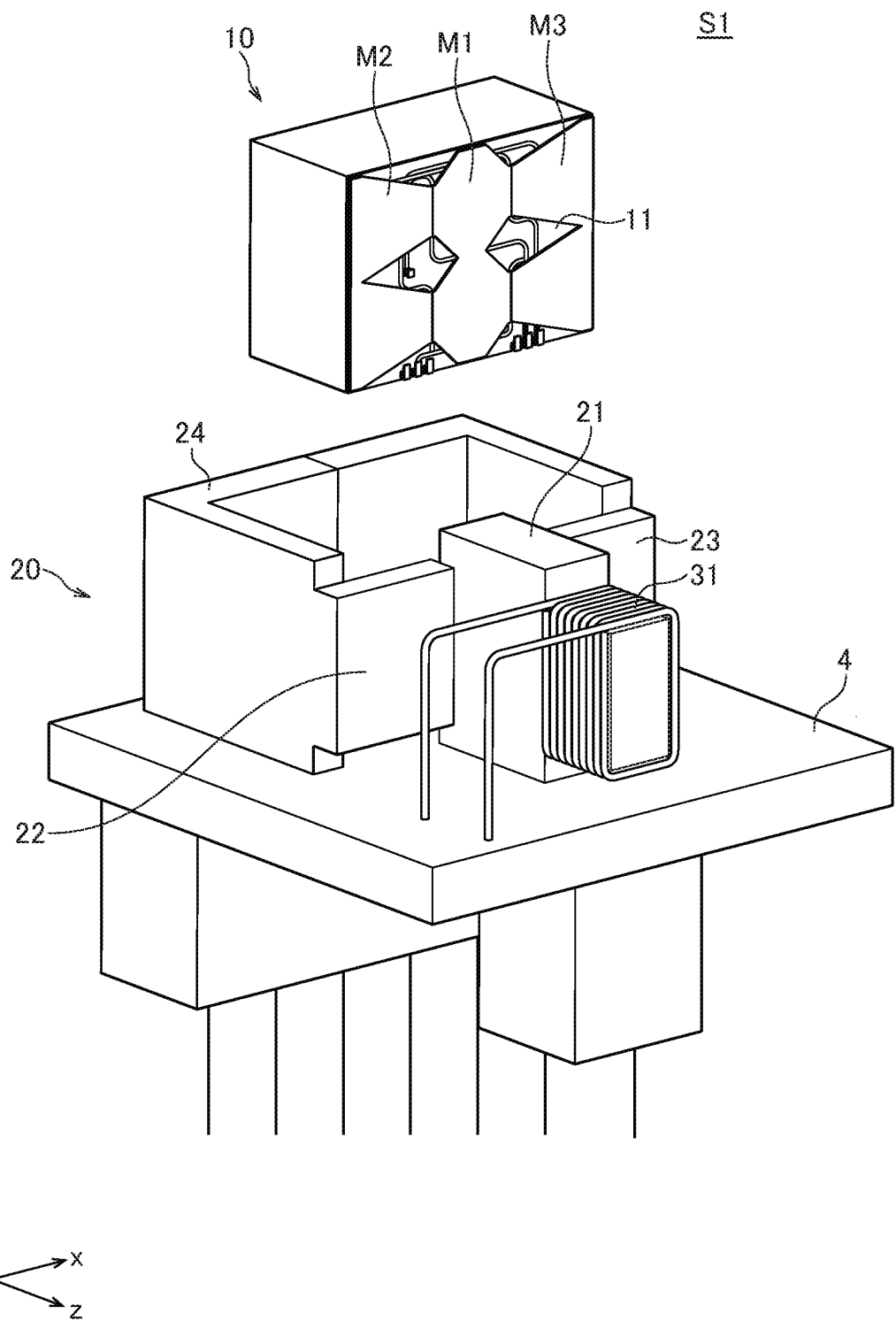
FIG. 2 is a schematic exploded perspective view for explaining the structure of the to-be-detected magnetic field sensor S1.

FIG. 2 is a schematic exploded perspective view for explaining the structure of the to-be-detected magnetic field sensor S1.

As illustrated in FIG. 2, the to-be-detected magnetic field sensor S1 has a sensor chip 10 and external magnetism collecting members 21 to 24, all of which are mounted on the main surface (xz plane) of a sensor substrate 4. The sensor chip 10 has an element formation surface 11 constituting the xy plane. The element formation surface 11 has magnetic thin films M1 to M3 made of a high permeability material such as permalloy. As viewed in the z-direction, magneto-sensitive elements to be described later are formed between the magnetic thin films M1 and M2 and between the magnetic thin films M1 and M3. The external magnetism collecting members 21 to 24 are blocks made of a high permeability material such as ferrite and collect a magnetic field in the z-direction to the sensor chip 10. Of the external magnetism collecting members 21 to 24, the external magnetism collecting members 21 to 23 are provided at positions overlapping the magnetic thin films M1 to M3, respectively, as viewed in the z-direction. The external magnetism collecting member 21 is separated from the external magnetism collecting members 22 and 23, and a magnetic field in the z-direction collected by the external magnetism collecting member 21 is applied to the magnetic thin film M1. The magnetic field applied to the magnetic thin film M1 is curved in the x-direction and flows to the magnetic thin films M2 and M3 through the magneto-sensitive elements. The magnetic field applied to the magnetic thin films M2 and M3 is collected to the external magnetism collecting members 22 and 23 and then flows to the external magnetism collecting member 24 covering the yz side surfaces and xy back surface of the sensor chip 10.

Figure 3:
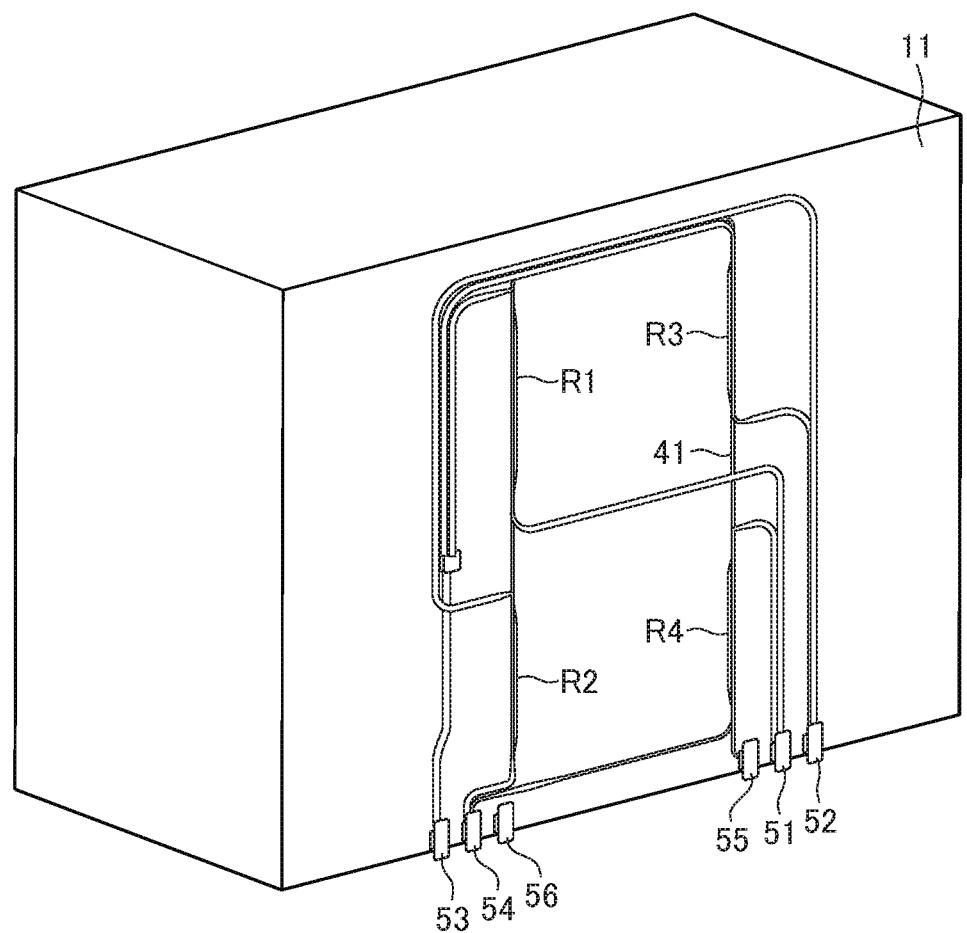
FIG. 3 is a schematic perspective view illustrating a state where the magnetic thin films M1 to M3 are removed from the sensor chip 10.
Figure 3:
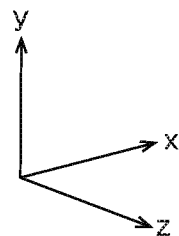

FIG. 3 is a schematic perspective view illustrating a state where the magnetic thin films M1 to M3 are removed from the sensor chip 10.

As illustrated in FIG. 3, magneto-sensitive elements R1 to R4 are formed on the element formation surface 11 of the sensor chip 10. The fixed magnetization directions of the respective magneto-sensitive elements R1 to R4 face to the positive x-direction. The magneto-sensitive elements R1 and R2 are disposed between the magnetic thin films M1 and M2 as viewed in the z-direction, the magneto-sensitive elements R3 and R4 are disposed between the magnetic thin films M1 and M3 as viewed in the z-direction. The magneto-sensitive elements R1 and R3 are connected in series in this order between a power supply terminal 51 and a ground terminal 52, and the magneto-sensitive elements R4 and R2 are connected in series in this order between the power supply terminal 51 and the ground terminal 52. The connection point of the magneto-sensitive elements R1 and R3 is connected to a signal terminal 53, and the connection point of the magneto-sensitive elements R4 and R2 is connected to a signal terminal 54.

Further, a compensation coil 41 is formed on the element formation surface 11 of the sensor chip 10 along the magneto-sensitive elements R1 to R4. The compensation coil 41 is a thin film coil constituted by a conductor pattern formed on the element formation surface 11, and one end thereof is connected to a coil terminal 55 and the other end thereof is connected to a coil terminal 56. Thus, when current is made to flow between the coil terminals 55 and 56, a cancelling magnetic field generated by the compensation coil 41 is applied to the magneto-sensitive elements R1 to R4.

Figure 4:
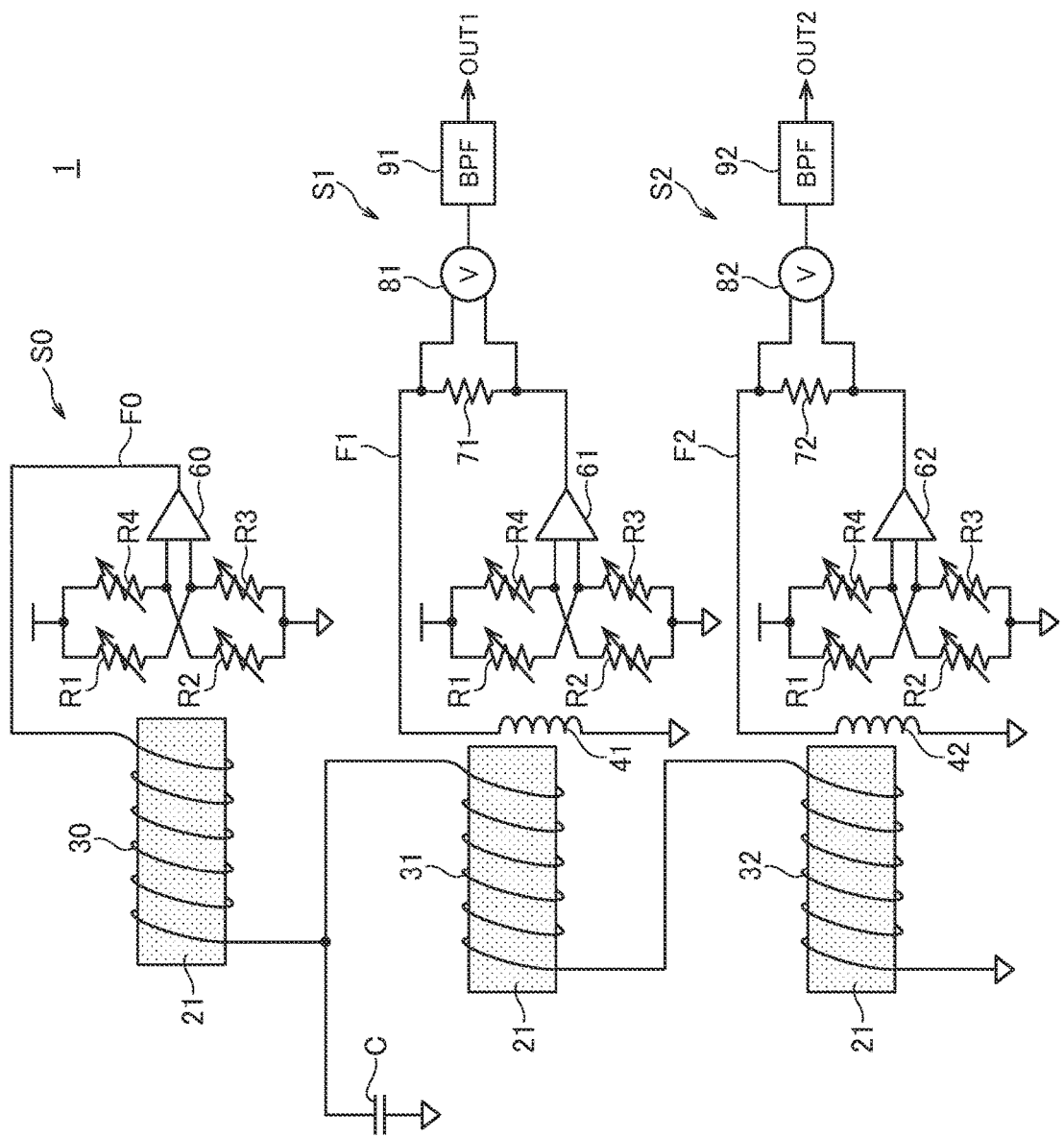
FIG. 4 is a circuit diagram of the magnetic sensor 1 according to the present embodiment.

FIG. 4 is a circuit diagram of the magnetic sensor 1 according to the present embodiment.

As illustrated in FIG. 4, the magneto-sensitive elements R1 to R4 included in the environmental magnetic field sensor S0 are full-bridge connected, and differential signal components therefrom is amplified by an amplifier 60. An environmental magnetic field signal F0 output from the amplifier 60 flows into a compensation coil 30 wound around the external magnetism collecting member 21 of the environmental magnetic field sensor S0. The compensation coil 30 generates a cancelling magnetic field for cancelling the environmental magnetic field applied to the environmental magnetic field sensor S0. With such closed-loop control, the environmental magnetic field applied to the magneto-sensitive elements R1 to R4 of the environmental magnetic field sensor S0 is always cancelled.

The external magnetism collecting members 21 of the to-be-detected magnetic field sensors S1 and S2 are also wound with compensation coils 31 and 32, respectively. The compensation coils 30 to 32 are connected in series through cables 3 illustrated in FIG. 1. A capacitor C is connected in parallel to the compensation coils 31 and 32. The capacitor C is mounted on the circuit board 2 illustrated in FIG. 1 and functions as a filter for removing an AC component in a predetermined frequency band from the environmental magnetic field signal F0 flowing in the compensation coil 30. The predetermined frequency band includes at least a frequency band of the AC component included in the environmental magnetic field. The AC component included in the environmental magnetic field includes power supply noise and the like, and the frequency band thereof is known in many cases. Thus, a DC component of the environmental magnetic field signal F0 flowing in the compensation coil 30 flows in the compensation coils 31 and 32. That is, the compensation coils 31 and 32 generate a cancelling magnetic field based on the DC component of the environmental magnetic field to thereby cancel the DC component of the environmental magnetic field.

The magneto-sensitive elements R1 to R4 included in the to-be-detected magnetic field sensor S1 are also full-bridge connected, and differential signal components appearing in the signal terminals 53 and 54 illustrated in FIG. 3 are amplified by an amplifier 61. A to-be-detected magnetic field signal F1 output from the amplifier 61 flows into the compensation coil 41 formed in the sensor chip 10. As a result, a to-be-detected magnetic field composed of the AC component and the environmental magnetic field composed of the AC component are applied to the magneto-sensitive elements R1 to R4 of the to-be-detected magnetic field sensor S1. The frequency band of the to-be-detected magnetic field and that of the environmental magnetic field differ from each other. With such double closed-loop control, the DC component of the environmental magnetic field is canceled by the compensation coil 31, and the AC component of the environmental magnetic field and to-be-detected magnetic field are canceled by the compensation coil 41. Thus, the to-be-detected magnetic field signal F1 corresponds to a synthetic component of the AC component of the environmental magnetic field and to-be-detected magnetic field. The to-be-detected magnetic field signal F1 is current-to-voltage converted by a resistor 71. The voltage across the resistor 71 is detected by a voltage sensor 81, and then the frequency band of the to-be-detected magnetic field is extracted by a band-pass filter 91. The frequency band of the AC component included in the environmental magnetic field is removed by the band-pass filter 91. As a result, a detection signal OUT1 output from the band-pass filter 91 indicates only the to-be-detected magnetic field at the position where the to-be-detected magnetic field sensor S1 is provided.

The same applies to the to-be-detected magnetic field sensor S2. That is, a to-be-detected magnetic field signal F2 output from the amplifier 62 is fed back to a compensation coil 42 and is current-to-voltage converted by a resistor 72. The voltage across the resistor 72 is detected by a voltage sensor 82, and then the frequency band of the to-be-detected magnetic field is extracted by a band-pass filter 92. The frequency band of the AC component included in the environmental magnetic field is removed by the band-pass filter 92. As a result, a detection signal OUT2 output from the band-pass filter 92 indicates only the to-be-detected magnetic field at the position where the to-be-detected magnetic field sensor S2 is provided.

As described above, the magnetic sensor 1 according to the present embodiment removes the AC component from the environmental magnetic field signal F0 using a filter constituted by the capacitor C and can thereby eliminate the influence of the AC component of the environmental magnetic field whose phase differs depending on spatial position. The AC component of the environmental magnetic field superimposed on the to-be-detected magnetic field signals F1 and F2 is removed by the band-pass filters 91 and 92, with the result that the environmental magnetic field component is removed from the detection signals OUT1 and OUT2. Thus, even when the DC and AC components coexist in the environmental magnetic field, it is possible to correctly detect the detection target magnetic field at the positions where the to-be-detected magnetic field sensors S1 and S2 are provided. In addition, in the present embodiment, a plurality of unit sensors each constituted by the magneto-sensitive elements and two compensation coils are provided, so that it is possible to detect the detection target magnetic field at a plurality of positions.

While the preferred embodiment of the present invention has been described, the present invention is not limited to the above embodiment, and various modifications may be made within the scope of the present invention, and all such modifications are included in the present invention.

Figure 5:
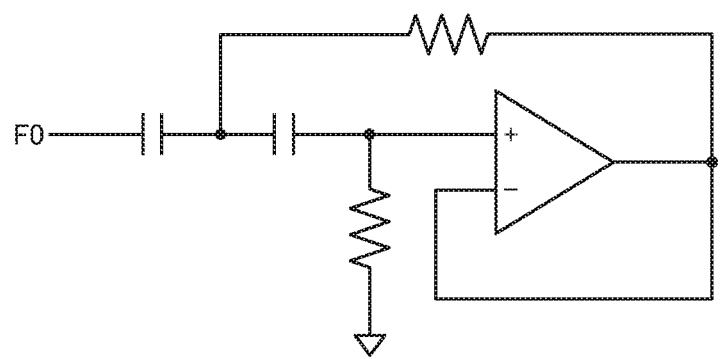
FIG. 5 is a circuit diagram of an active filter.

For example, although the capacitor C is connected between the connection point of the compensation coils 30 and 31 and the ground to constitute an LC filter in the above embodiment, a resistor may be used in place of the capacitor C to constitute an LR filter. Alternatively, an active filter illustrated in FIG. 5 may be used to remove the AC component of the environmental magnetic field.

Further, although the AC component of the environmental magnetic field is removed using the band-pass filters 91 and 92 in the above embodiment, a high-pass filter, a low-pass filter, or the like may be used as long as the AC component of the environmental magnetic field can be removed.

What is claimed is:

1. A magnetic sensor comprising:
a first magnetic field sensor that detects an environmental magnetic field to generate a first magnetic field signal;
a second magnetic field sensor that detects a detection target magnetic field to generate a second magnetic field signal;
a first filter that removes an AC component in a predetermined frequency band from the first magnetic field signal to extract a DC component;
a first compensation coil that applies a first cancelling magnetic field to the second magnetic field sensor based on the DC component;
a second compensation coil that applies a second cancelling magnetic field to the second magnetic field sensor based on the second magnetic field signal; and
a second filter that removes an AC component in at least a predetermined frequency band from the second magnetic field signal.

2. The magnetic sensor as claimed in claim 1,
wherein the second magnetic field sensor includes an external magnetism collection member that collects a magnetic field, and
wherein the first compensation coil is wound around the external magnetism collection member.

3. The magnetic sensor as claimed in claim 2,
wherein the second magnetic field sensor includes a magneto-sensitive element formed in a sensor chip, and
wherein the second compensation coil is a thin-film coil formed in the sensor chip.

4. The magnetic sensor as claimed in claim 1, wherein a plurality of unit sensors each constituted by the second magnetic field sensor and first and second compensation coils are provided.

5. The magnetic sensor as claimed in claim 4, wherein the first compensation coils included in the plurality of unit sensors are connected in series to each other.

* * * * *